US009816798B2

(12) United States Patent
Kouno et al.

(10) Patent No.: US 9,816,798 B2
(45) Date of Patent: Nov. 14, 2017

(54) POSITION DETECTOR HAVING A GAP WIDTH DIFFERENT FROM A MAGNET WIDTH

(71) Applicant: DENSO CORPORATION, Kariya, Aichi-pref. (JP)

(72) Inventors: Naoaki Kouno, Chiryu (JP); Tetsuji Yamanaka, Obu (JP)

(73) Assignee: DENSO CORPORATION, Kariya (JP)

( * ) Notice: Subject to any disclaimer, the term of this patent is extended or adjusted under 35 U.S.C. 154(b) by 210 days.

(21) Appl. No.: 14/142,456

(22) Filed: Dec. 27, 2013

(65) Prior Publication Data

US 2014/0184205 A1 Jul. 3, 2014

(30) Foreign Application Priority Data

Dec. 27, 2012 (JP) .................................. 2012-286096

(51) Int. Cl.
*G01B 7/30* (2006.01)
*G01B 7/14* (2006.01)
(Continued)

(52) U.S. Cl.
CPC ................ *G01B 7/14* (2013.01); *G01B 7/003* (2013.01); *G01B 7/30* (2013.01); *G01D 5/145* (2013.01); *G01R 33/072* (2013.01)

(58) Field of Classification Search
CPC . G01B 7/14; G01B 7/305; G01B 7/31; G01B 7/312; G01B 7/30; G01B 7/02; G01B 7/023; G01B 7/04; G01B 7/046; G01B 7/003; H01L 43/00; H01L 43/06; H01L 43/08; G01R 33/0094; G01R 15/20; G01R 15/202; G01R 15/205; G01R 33/072; G01D 5/145; G01D 5/2216; G01D 5/2225; G01D 5/2233; G01D 5/2241; G01D 5/225;
(Continued)

(56) References Cited

U.S. PATENT DOCUMENTS 4,810,965 A * 3/1989 Fujiwara et al. ........ 324/207.22
7,463,023 B1 * 12/2008 Moreno et al. .......... 324/207.25
(Continued)

FOREIGN PATENT DOCUMENTS

JP    S63-153421 A    6/1988
JP    3-103712        4/1991
(Continued)

OTHER PUBLICATIONS

Office Action (2 pages) dated Dec. 11, 2014 issued in corresponding Japanese Application No. 2012-286096 and English translation (2 pages).
(Continued)

*Primary Examiner* — David M. Schindler
(74) *Attorney, Agent, or Firm* — Nixon & Vanderhye P.C.

(57) ABSTRACT

A position detector has first and second magnets with a magnet width that is different from a gap width of a gap. As a result, the gap width and the magnet width are independent of each other. The gap width is minimized relative to a molding member that molds a Hall element. The first and second magnets have a specific magnet width that generates a required magnetic flux density without increasing the magnet width, which enables a volume reduction of the position detector.

6 Claims, 10 Drawing Sheets

(51) Int. Cl.
  *G01B 7/00* (2006.01)
  *G01R 33/07* (2006.01)
  *G01D 5/14* (2006.01)

(58) Field of Classification Search
  CPC .. G01D 5/2258; G01D 5/2266; G01D 5/2275; G01D 5/2283; G01D 5/20; G01D 5/2006; G01D 5/2013; G01D 5/202; G01D 5/2026; G01D 5/2033; G01D 5/204; G01D 5/2046; G01D 5/2053; G01D 5/206; G01D 5/22; G01D 5/2208; G01D 5/14; G01D 5/142; G01D 5/147; G01D 5/16
  See application file for complete search history.

(56) References Cited

U.S. PATENT DOCUMENTS

2002/0118011 A1* 8/2002 Wolf ........................ 324/207.2
2004/0008025 A1* 1/2004 Johnson et al. ......... 324/207.24

FOREIGN PATENT DOCUMENTS

| JP | 08-292004 | 11/1996 |
| JP | 9-318305 | 12/1997 |
| JP | 10-104044 | 4/1998 |
| JP | 2007-187540 | 7/2007 |
| JP | 2014-126553 | 7/2014 |

OTHER PUBLICATIONS

Office Action (1 page) dated Mar. 3, 2015 issued in corresponding Japanese Application No. 2012-286096 and English translation (1 page).
Kouno, et al., U.S. Appl. No. 14/142,434, filed Dec. 27, 2013.
Kouno, et al., U.S. Appl. No. 14/142,168, filed Dec. 27, 2013.
Kouno, et al., U.S. Appl. No. 14/142,195, filed Dec. 27, 2013.
Kouno, et al., U.S. Appl. No. 14/142,154, filed Dec. 27, 2013.
Kouno, et al., U.S. Appl. No. 14/142,146, filed Dec. 27, 2013.
Yamanaka, et al., U.S. Appl. No. 14/142,133, filed Dec. 27, 2013.

* cited by examiner

POSITION DETECTOR HAVING A GAP WIDTH DIFFERENT FROM A MAGNET WIDTH

CROSS-REFERENCE TO RELATED APPLICATION

The present application is based on and claims the benefit of priority of Japanese Patent Application No. 2012-286096 filed on Dec. 27, 2012, the disclosure of which is incorporated herein by reference.

TECHNICAL FIELD

The present disclosure generally relates to a position detector for detecting a position of a detection object.

BACKGROUND

Generally, a magnetic-type position detector detects a change in the position of a detection object relative to a reference part. For example, a position detector disclosed in a patent document 1 (i.e., Japanese Patent Laid-Open No. JP-A-H08-292004) is configured (i) to form a closed magnetic circuit with two magnets and two yokes. The position detector also has a magnetic flux density detector disposed inside of the closed magnetic circuit within a gap between the two yokes. Each of the two yokes has a flat board shape, and the width of the gap between the two yokes is constant along the longitudinal direction of the yoke and at all positions throughout the entire longitudinal length of the two yokes. The two flat board shape yokes generally bind or sandwich the two magnets. That is, one of the two magnets is positioned between a first end of each yoke and the other one of the two magnets is positioned between a second end of each yoke.

Magnetic fluxes flowing out from an N pole of one magnet are categorized into three types, a return magnetic flux that flows through one of the two yokes and flowing from one magnet to the other magnet, a spill magnetic flux that flows from one yoke into the gap between the two yokes and flows to the other yoke, and a direct magnetic flux that flows directly without passing through any yoke into the gap between the two yokes and flows to an S pole. The magnetic flux density detector detects the following two types of flux flowing therein, that is, either one or both of the spill magnetic flux and the direct magnetic flux. The density of the magnetic flux passing through the magnetic flux density detector changes according to a position of the magnetic flux density detector relative to the yoke. The position detector detects a position of the detection object based on the density of the magnetic flux which is detected by the magnetic flux density detector.

In the position detector disclosed in the patent document 1, the width of the magnet is equal to the width of the gap between the two yokes, and the width of the gap between the two yokes is determined as a total width of the in-between components (i.e., a sum of the width of two magnetic flux collection members and the width of the magnetic flux density detector). Therefore, when the gap between the two yokes is required to be larger than an optimal width of the magnet for generating a required magnetic flux density due to the total width of the two magnetic flux collection members and the magnetic flux density detector interposed therebetween, the size and width of the magnet must also be larger in order to fill the larger-than-required gap width between the two yokes. As a result, the position detector increases in volume which results in unnecessary costs of having a larger-than-required magnet. Further, when the total width of the two magnetic flux collection members and the magnetic flux density detector is less than the optimal width of the magnet for generating the required magnetic flux density, the width of the gap between the two yokes, which have a flat board shape, is larger than the width defined by the optimal width of the magnet, which also results in unnecessary costs of having a larger-than-required position detector.

SUMMARY

It is an object of the present disclosure to provide a position detector that has a smaller overall size and volume.

In an aspect of the present disclosure, the position detector for detecting a position of a detection object relative to a reference part, the position detector includes a first magnetic flux transmission part disposed on one of the reference part or the detection object. The first magnetic flux transmission part has a first end and a second end and a second magnetic flux transmission part disposed to define a gap between the first magnetic flux transmission part and the second magnetic flux transmission part. The second magnetic flux transmission part has a first end and a second end. A first magnetic flux generator disposed at a position between the first end of the first magnetic flux transmission part and first end of the second magnetic flux transmission part. A second magnetic flux generator is disposed at a position between the second end of the first magnetic flux transmission part and the second end of the second magnetic flux transmission part. A magnetic flux density detector is positioned within the gap, disposed on an other of the reference part or the detection object, and outputs a signal according to a density of a magnetic flux passing through the magnetic flux density detector.

Specifically, in the present disclosure, when the gap has a gap width, which is defined by a widthwise measurement of the gap in an orthogonal direction between the first and second magnetic flux transmission parts, a magnet width in the orthogonal direction of the first magnetic flux generator and second magnetic flux generator is configured to be different from the gap width.

Therefore, the width of the magnet may be independent of the width of the gap between the two magnetic flux transmission parts. In such a structure, the magnet may have an optimal width for generating a required magnetic flux density, regardless of the gap width between the two magnetic flux transmission parts, thereby preventing an increase in the volume and size of the magnet. That is, the magnet will not have a width that is larger-than-required in order to fill a vacant space which occurs when the magnet is smaller than the gap between the yokes when the yokes have a straight flat board shape. Further, the dimension of the gap between the two magnetic flux transmission parts may be a smaller and narrower in size, with regard to the width of the magnetic flux density detector, thereby realizing a position detector having a small volume.

Further, the magnet widths of the first magnetic flux generator and the second magnetic flux generator are smaller than the gap width of the gap.

Even further, the magnet widths of the first magnetic flux generator and the second magnetic flux generator are greater than the gap width of the gap.

Additionally, the first magnetic flux transmission part and the second magnetic flux transmission part are disposed on the detection object and the magnetic flux density detector is disposed on the reference part.

Moreover, when assuming that, a detection range is defined as an angular range within which a position of the detection object is detected, a range of movement is defined as a range of movement of the magnetic flux density detector within the gap, an actual output line represents a relationship between the position of the detection object and the output signal of the magnetic flux density detector, a point 0 is defined as a point on the actual output line where an amount of the magnetic flux passing through the magnetic flux density detector is equal to zero, and an ideal straight line is defined as a line passing the point 0 and having an ideal slope, the range of movement includes a signal difference between an output signal of the actual output line and an output signal of the ideal straight line in the detection range that is less than or equal to a predetermined value.

Further, when a detection range is defined as an angular range within which a position of the detection object is detected, a range of movement is defined as a range of movement of the magnetic flux density detector within the gap and relative to the first magnetic flux transmission part, and a direction of relative movement is defined as a direction of a movement of the magnetic flux density detector relative to the first magnetic flux transmission part, a center of the detection range along the direction of relative movement is shifted from a center of the range of movement along the direction of relative movement.

Even further, the detection object rotates relative to the reference part, and the first magnetic flux transmission part and the second magnetic flux transmission part have an arc shape along a direction of relative movement of the detection object with respect to the reference part.

Additionally, the detection object moves linearly relative to the reference part, and the first magnetic flux transmission part and the second magnetic flux transmission part have a linear shape that linearly extends along a direction of relative movement of the detection object with respect to the reference part.

BRIEF DESCRIPTION OF THE DRAWINGS

Objects, features, and advantages of the present disclosure will become more apparent from the following detailed description made with reference to the accompanying drawings, in which.

DETAILED DESCRIPTION

Figure 1:
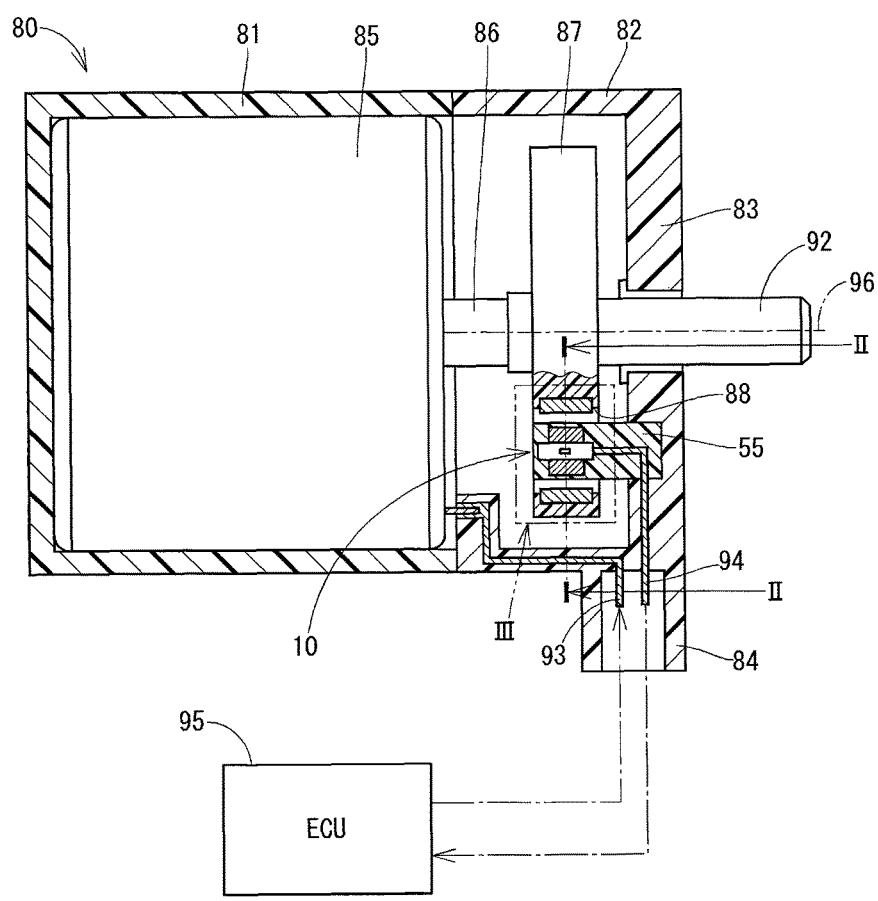
FIG. 1 is an outline configuration of a rotary drive apparatus to which a position detector in a first embodiment of the present disclosure is applied.

Plural embodiments of the present disclosure are described based on the drawings. Like parts have like numbers in the drawings and the description of the same is not repeated for the brevity of the description.

First Embodiment

The position detector in the first embodiment of the present disclosure is applied to a rotary drive apparatus shown in FIG. 1. A rotary drive apparatus 80 is used to perform an open-and-close drive of a wastegate valve (not illustrated). In a turbocharged engine, the wastegate valve diverts a flow of exhaust gas around the turbine housing of a turbocharger.

First, the configuration of the rotary drive apparatus 80 is explained based on FIG. 1. The rotary drive apparatus 80 is provided with a housing 81, a case 82, a motor 85, a rotating body 87, an output shaft 92, and a position detector 10.

The housing 81 has a cavity for a motor. The housing 81 may be fixed onto a vehicle body or onto a member that is attached to the vehicle body.

The case 82 forms a cover part 83 that is fixed to an opening of the housing 81. The case 82 also has a connector part 84 that projects toward an outside of the case 82 from the cover part 83.

The motor 85 is positioned in the housing 81 and is electrically connected to an electronic control unit (ECU) 95 via a power terminal 93. The motor 85 rotates a motor shaft 86 when electric power is supplied by the ECU 95.

The rotating body 87 is a disk member that is coaxially disposed on the motor shaft 86. The rotating body 87 has an arc-shape through-hole 88 that extends in a circumferential direction at a position away from an axial center 96 of the disk shape. The rotating body 87 is connected to the motor shaft 86, which enables a transmission of rotation of the body 87 to the motor shaft 86.

The output shaft 92 is coaxially disposed on the motor shaft 86 and is rotatably supported by the case 82. The output shaft 92 is also connected to the rotating body 87, which enables a transmission of rotation of the body 87 to the shaft 92. The output shaft 92 is connected to the wastegate valve via a linkage mechanism which is not illustrated.

The position detector 10 is disposed at a position along the motor shaft 86 having the same axial position as the rotating body 87. The position detector 10 is also disposed at a radial position (i.e., a position along a radius of the apparatus 80) that is eccentrically shifted away from the axial center 96, for detecting a relative rotation angle of the rotating body 87 relative to the case 82. The case 82 may be equivalent to a reference part in the claims, and the rotating body 87 may be equivalent to a detection object in the claims. The position detector 10 is electrically connected to the ECU 95 via a signal terminal 94.

When the electric power is supplied from the ECU 95, the rotary drive apparatus 80 rotates the output shaft 92 by the motor 85 and outputs a voltage according to a rotation angle of the rotating body 87 from the position detector 10 to the ECU 95. The ECU 95 drives the motor 85 based on the output voltage of the position detector 10, and performs a feedback control so that the rotation angle of the rotating body 87 matches a target value.

Figure 2:
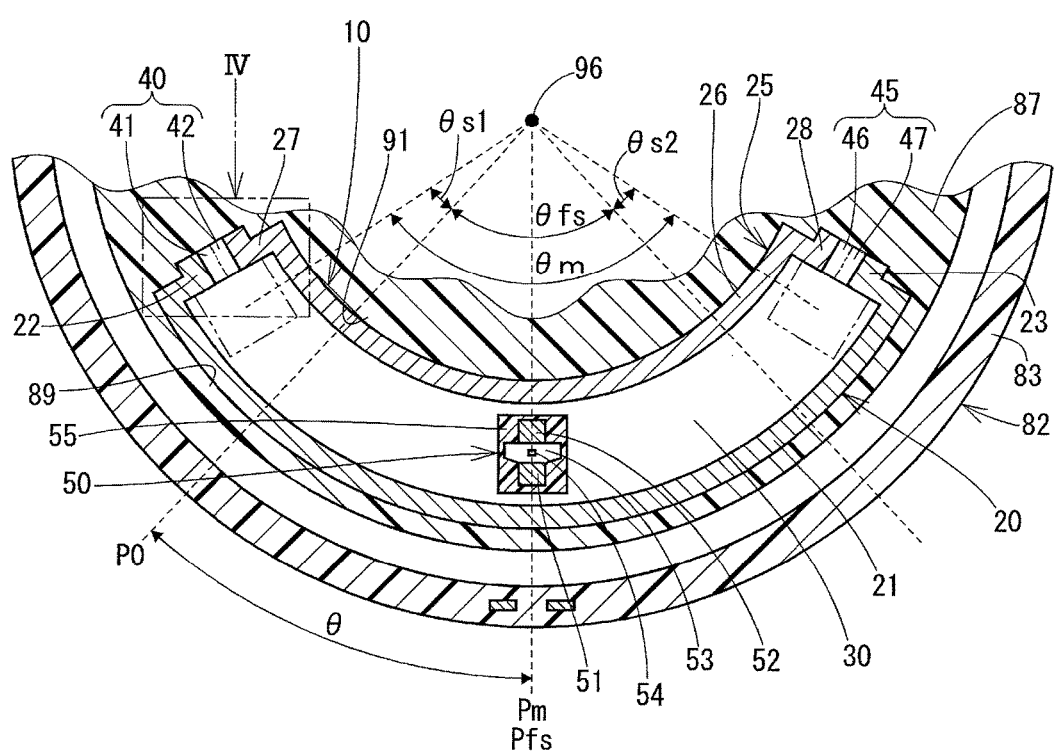
FIG. 2 is a line II-II sectional view of FIG. 1.
Figure 3:
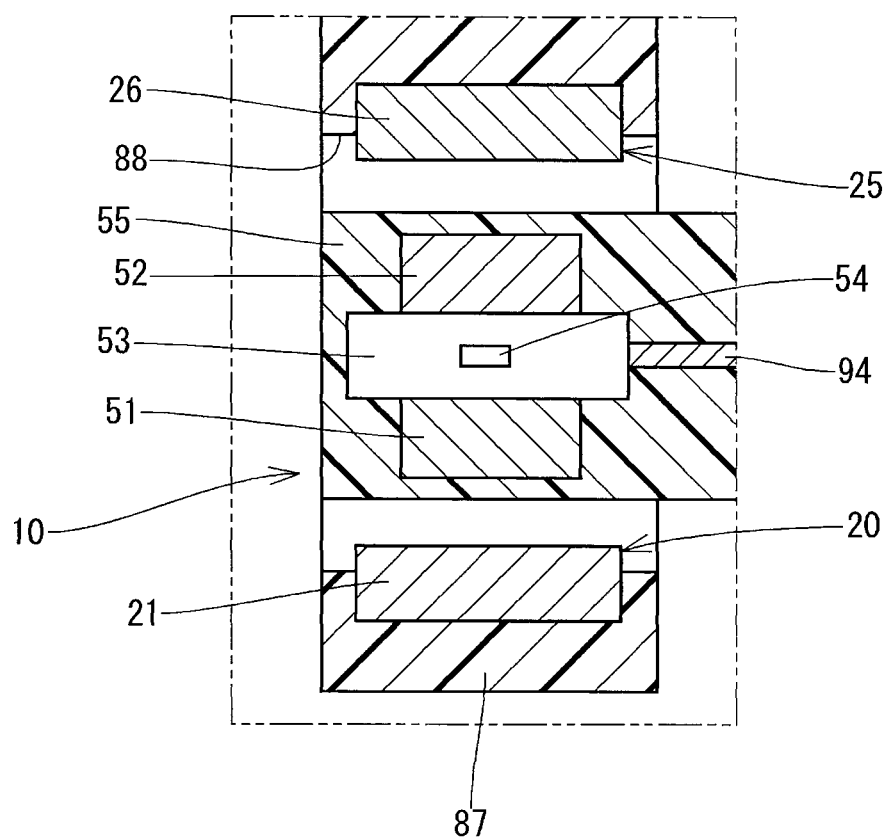
FIG. 3 is an expanded sectional view of an arrow III indicated portion of FIG. 1.
Figure 4:
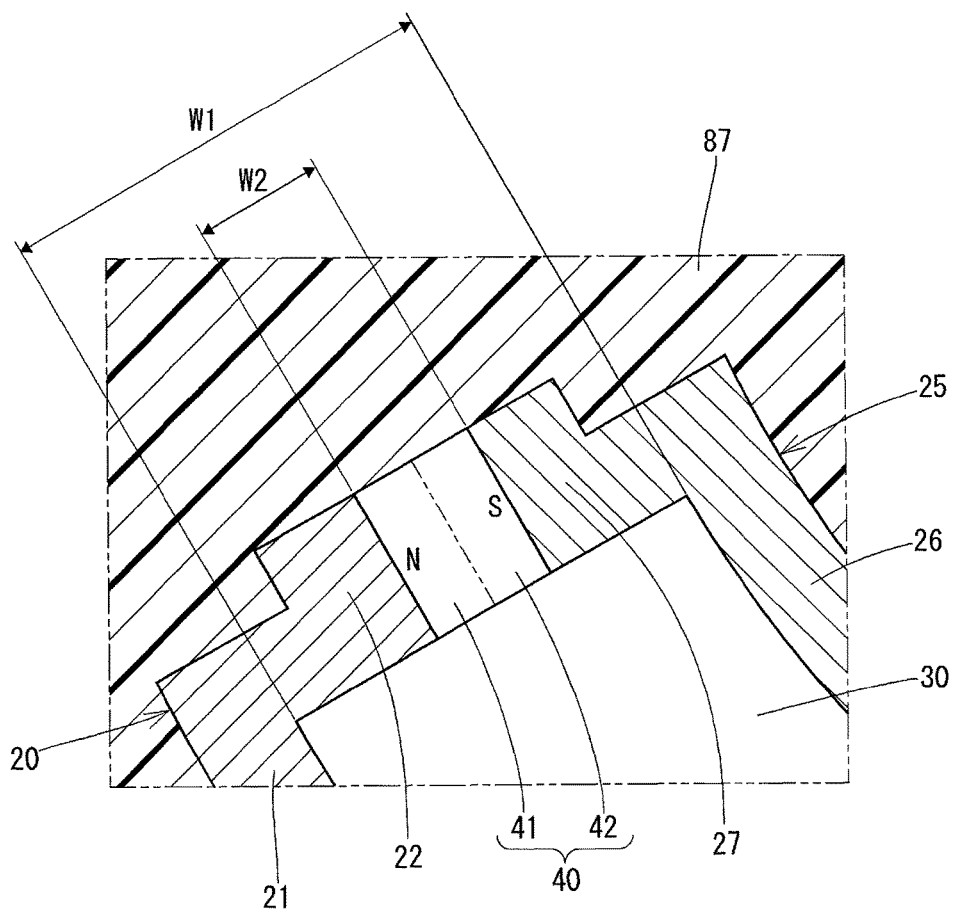
FIG. 4 is an expanded sectional view of an arrow IV indicated portion of FIG. 2.

The configuration of the position detector 10 is explained based on FIGS. 1 to 3 in the following.

The position detector 10 is provided with a first yoke 20, a second yoke 25, a first magnet 40, a second magnet 45, and a short-circuiting magnetic path part 50.

The first yoke 20 is made of a soft magnetic material, and forms an outer arc portion 21 that extends along an inward-facing wall 89 of the through-hole 88 of the rotating body 87. Further, the first yoke 20 extends from a first end 22 of the first yoke 20 to a second end 23 of the first yoke 20. The first yoke 20 is fixed onto the rotating body 87, and may be equivalent to a first magnetic flux transmission part in the claims.

The second yoke 25 is made of a soft magnetic material, and forms an inner arc portion 26 that extends along the outward-facing wall 91 of the through-hole 88 of the rotating body 87. Further, the second yoke 25 extends from a first end 27 of the second yoke 25 to a second end 28 of the second yoke 25. The outer arc portion 21 of the first yoke 20 and the inner arc portion 26 of the second yoke 25 define a gap 30. The gap 30 has an arc shape extending in the circumferential direction of the case 82. The second yoke 25 is fixed onto the rotating body 87, and may be equivalent to a second magnetic flux transmission part in the claims.

The first magnet 40 is disposed at a position between the first end 22 of the first yoke 20 and the first end 27 of the second yoke 25, and may be equivalent to a first magnetic flux generator in the claims. In the present embodiment, the magnetization direction of the first magnet 40 matches with a radial direction of the rotating body 87. As such, an N pole 41 is positioned toward a radial outside of the magnet 40 and an S pole 42 is positioned toward a radial inside of the magnet 40.

The second magnet 45 is disposed at a position between the second end 23 of the first yoke 20 and the second end 28 of the second yoke 25, and may be equivalent to a second magnetic flux generator in the claims. In the present embodiment, the magnetic force of the second magnet 45 is the same as the magnetic force of the first magnet 40. The magnetization direction of the second magnet 45 matches with a radial direction of the rotating body 87. As such, an N pole 46 is positioned toward a radial inside of the magnet 45 and an S pole 47 is positioned toward a radial outside of the magnet 45. That is, the polarity of the second magnet 45 is opposite to the polarity of the first magnet 40.

The first yoke 20 and the second yoke 25 are magnetic circuit components, which connect the first magnet 40 and the second magnet 45, and form a closed magnetic circuit together with the first magnet 40 and the second magnet 45. Magnetic fluxes flowing out from the N pole 41 of the first magnet 40 include a return magnetic flux that flows through the first yoke 20 to flow to the second magnet 45, a spill magnetic flux that flows from the first yoke 20 through the gap 30 to flow to the second yoke 25, and a direct magnetic flux that flows through the gap 30 to the S pole 42 without passing through the first yoke 20 and the second yoke 25. Further, magnetic fluxes flowing out from the N pole 46 of the second magnet 45 include a return magnetic flux that flows through the second yoke 25 to flow to the first magnet 40, a spill magnetic flux that flows from the second yoke 25 through the gap 30 to flow to the first yoke 20, and a direct magnetic flux that flows through the gap 30 to the S pole 47 without passing through the first yoke 20 and the second yoke 25.

The short-circuiting magnetic path part 50 has a Hall IC 53, a magnetic flux collecting yokes 51, 52 for collecting and concentrating a leak magnetic flux to flow to the Hall IC 53.

The magnetic flux collecting yokes 51, 52 and the Hall IC 53 are positioned on a molded member 55 that is made of resin. The molded member 55 is fixed onto the case 82. The magnetic flux collecting yoke 51, 52 are disposed so that the magnetic flux collecting yoke 51, 52 are radially aligned within the gap 30. The Hall IC 53 is disposed at a position between the magnetic flux collecting yoke 51, 52 and has a Hall element 54. The Hall element 54 is a magneto-electric transducer using the Hall effect, and may be equivalent to a magnetic flux density detector in the claims. The Hall element 54 outputs a voltage according to the density of the magnetic flux passing through its magneto-sensitive surface. The density of the magnetic flux passing through the Hall element 54 varies by increasing or decreasing when the position of the Hall element 54 relative to a closed magnetic circuit changes according to the relative rotation of the rotating body 87. In the present embodiment, one Hall element 54 is disposed.

The feature components in the position detector 10 are described based in FIGS. 2 and 4-6. The following description assumes that (i) the width of the gap 30 between the first yoke 20 and the second yoke 25 is measured in the radial direction relative to the radius of the cylindrical shape of the apparatus 80, and (ii) the first yoke 20 and the second yoke 25 move relative to the short-circuiting magnetic path part 50 in a direction of relative movement.

A gap width W1 of the gap 30 measured along the radial direction is constant at all positions along the direction of relative movement. The gap width W1 of the gap 30 may be minimized according to the size of the molded member 55 of the Hall element 54. Further, a magnet width W2 of the first magnet 40 and the second magnet 45 taken along the radial direction is, without depending on the gap width W1, sized to have an optimum value for generating a required amount of magnetic flux. In the present embodiment, the magnet width W2 is smaller than the gap width W1.

Figure 5:
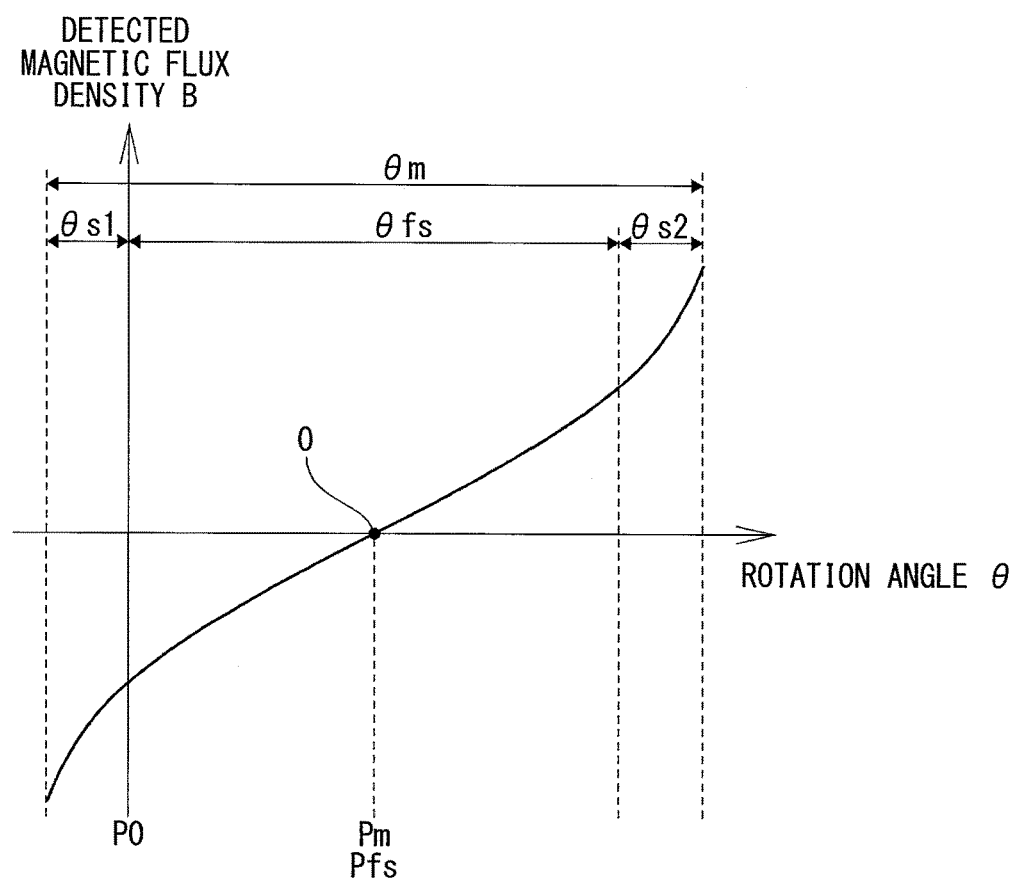
FIG. 5 is a figure illustrating a relationship between a rotation angle and a density of the magnetic flux passing through a Hall element.
Figure 6:
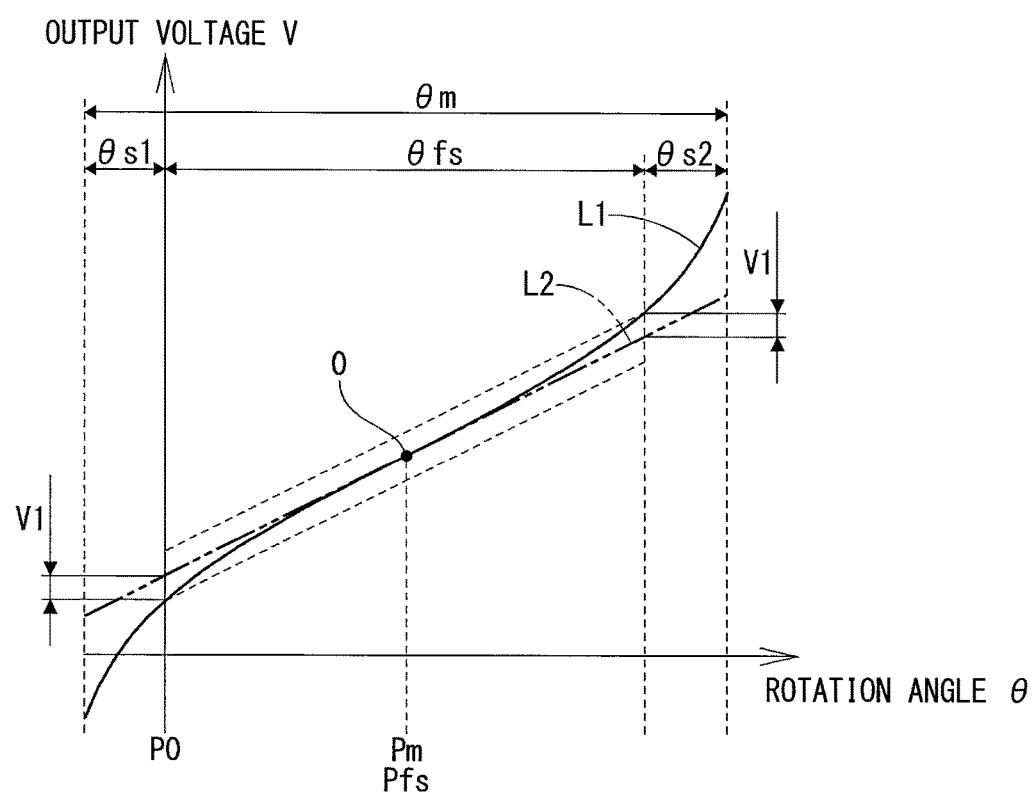
FIG. 6 is an output characteristic diagram of the Hall element in FIG. 2.

FIG. 5 shows a relationship between a relative rotation angle θ of the rotating body 87 relative to the case 82 and a detected magnetic flux density B which passes through the Hall element 54 in an orthogonal coordinate system. FIG. 6 shows a relationship between the rotation angle θ and a converted output voltage V that is converted from the detected magnetic flux density B by the Hall IC 53. The rotation angle θ is equivalent to a position of a detection object in the claims, and the output voltage V is equivalent to an output signal in the claims. Further, with reference to FIGS. 5 and 6, a point P0 is defined as a point at which the detected magnetic flux density B is equal to zero, and an ideal straight line L2 passing through the point P0 and having an ideal slope 'a' is represented by a two-dot chain line. When an angular range that is detectable by using the position detector 10 is designated as a detection range θfs, and a range of movement of the Hall element 54 which allows a relative movement of the Hall element 54 relative to the first yoke 20 in the gap 30 is designated as a range of movement θm, the range of movement θm in the present embodiment is set to have a difference voltage, which is a difference between an actual output line L1 and the ideal straight line L2 in the detection range θfs, equal to or smaller than a predetermined value V1. The predetermined value V1 is a value determined in consideration of a required accuracy. That is, when assuming that, a detection range (θfs, θfs') is defined as an angular range within which a position of the detection object is detected, a range of movement (θm, θm') is defined as a range of movement of the magnetic flux density detector within the gap, an actual output line (L1) represents a relationship between the position (θ) of the detection object and the output signal (V) of the magnetic flux density detector, a point 0 (zero) is defined as a point on the actual output line where an amount of the magnetic flux passing through the magnetic flux density detector is equal to zero, and an ideal straight line (L2) is defined as a line passing the point 0 and having an ideal slope, the range of movement includes a signal difference between an output signal of the actual output line and an output signal of the ideal straight line in the detection range that is less than or equal to a predetermined value (V1).

Specifically, the size of the gap 30 along the direction of relative movement is determined by going through the following steps of (1), (2), (3), and (4) in the following order. In the following, the range of movement $\theta m$ is divided into three mutually-exclusive ranges, i.e., a first surplus angle $\theta s1$ on one side of the detection range $\theta fs$, a second angle $\theta s2$ on the other side of the angle $\theta fs$, and the angle $\theta fs$ itself.

(1) The detection range $\theta fs$ is determined.

(2) As shown in FIG. 5, the change of the detected magnetic flux density B becomes extremely large under the influence of the above-mentioned direct magnetic flux. Since the influence of the direct magnetic flux is determined by a distance from the first magnet 40 and the second magnet 45, the linearity of the output voltage V is determined by a setting of the first surplus angle $\theta s1$ and the second surplus angle $\theta s2$. Therefore, the first surplus angle $\theta s1$ and the second surplus angle $\theta s2$ are determined so that the maximum value of the voltage difference between the actual output line L1 and the ideal straight line L2 in the detection range $\theta fs$ is measured as being equal to or smaller than the predetermined value V1.

(3) The range of movement $\theta m$ is determined as a value that is calculated as a sum of the first surplus angle $\theta s1$, the second surplus angle $\theta s2$, and the detection range $\theta fs$.

(4) Based on the range of movement $\theta m$ and the size of the molded member 55 along the direction of relative movement, the size of the gap 30 along the direction of relative movement is determined.

In the present embodiment, the first surplus angle $\theta s1$ is the same as the second surplus angle $\theta s2$. Further, a center position Pfs of the detection range $\theta fs$ along the direction of relative movement coincides with a center position Pm of the range of movement $\theta fs$ along the direction of relative movement. Further, the first and second magnets 40, 45 have the same magnetic force. Therefore, the center position Pm is an angle position that corresponds to the point 0.

As explained above, in the position detector 10 of the first embodiment, the magnet width W2 of the first and second magnets 40, 45 is smaller than the gap width W1 (i.e., is different from the gap width W1). That is, the gap width W1 of the gap 30 may be sized without consideration of the magnet width W2 of the first and second magnets 40, 45. The gap width W1 of the gap 30 can be sized to be as small as possible in relation to the molded member 55 which molds the Hall element 54. Further, the magnet width W2 of the first and second magnets 40, 45 can be sized as the optimal width for generating a required magnetic flux density, which prevents a needless increase of the magnet size. Therefore, a smaller volume of the position detector 10 is achieved.

Further, in the first embodiment, a closed magnetic circuit is disposed in the rotating body 87, and the Hall IC 53 is disposed in the case 82. Therefore, the closed magnetic circuit is rotated together with the rotating body 87, while the Hall IC 53, which has a wired connection, has a fixed position. In other words, a wired connection that may be required for making the Hall IC movable is dispensed with, which enables the position detector 10 to have a simple structure.

Further, in the first embodiment, the range of movement $\theta m$ is determined so that the voltage difference between the actual output line L1 and the ideal straight line L2 in the detection range $\theta fs$ is equal to or smaller than the predetermined value V1, which is determined in consideration of the required accuracy. That is, the size of the gap 30 is determined to yield the required accuracy in the detection range $\theta fs$. Therefore, such a determination that considers the required accuracy, may produce an output voltage V of the Hall element 54 having satisfactory linearity.

Second Embodiment

Figure 7:
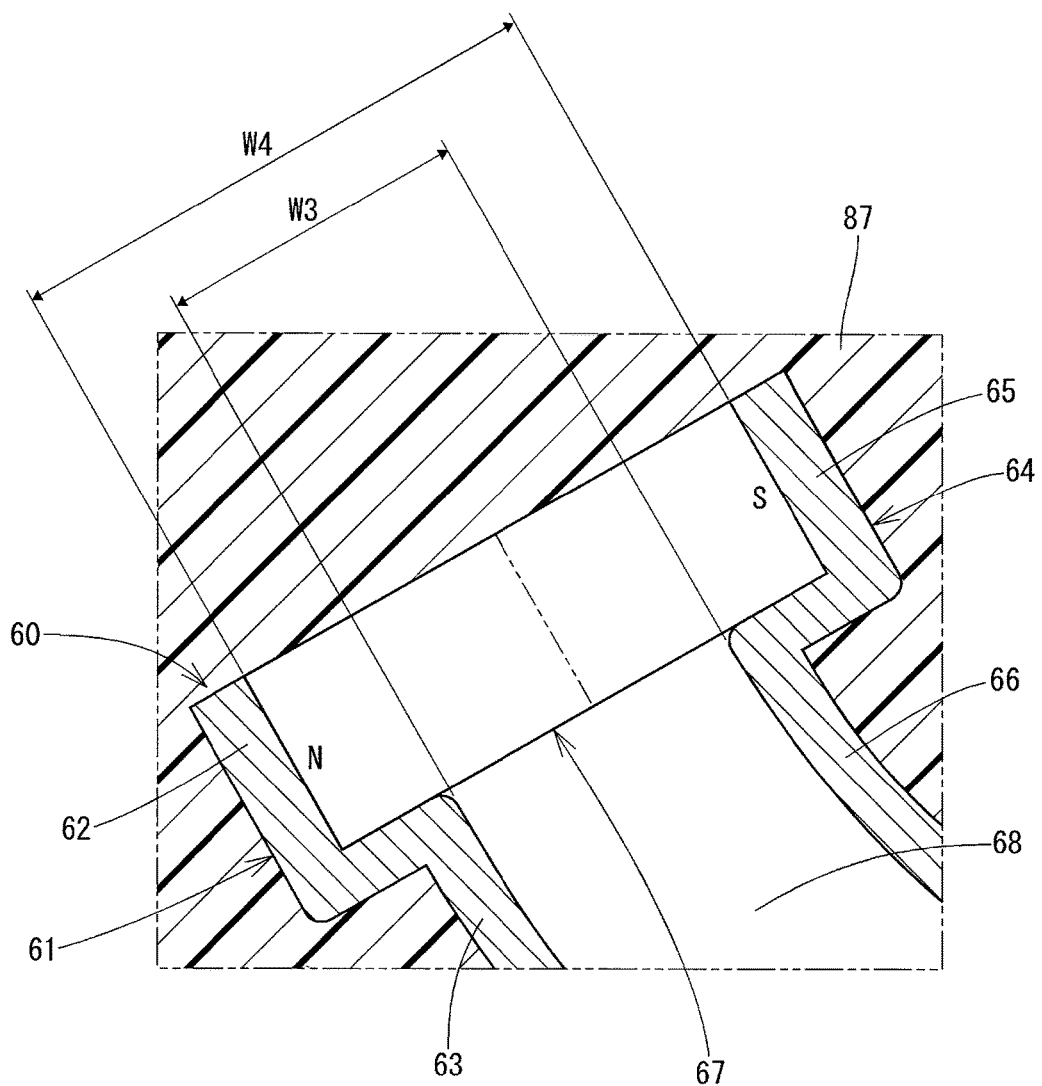
FIG. 7 is a sectional view of a first end of a first yoke and a first end of a second yoke of the position detector in a second embodiment of the present disclosure.

The position detector in the second embodiment of the present disclosure is explained based on FIG. 7.

A position detector 60 is provided with a first yoke 61 and a second yoke 64. A first magnet 67 is disposed at a position between a first end 62 of the first yoke 61 and a second end 65 of the second yoke 64, and the second magnet is disposed at a position between the other end of the first yoke 61 and the other end of the second yoke 64. The other end of the first yoke 61, the other end of the second yoke 64, and the configuration of the second magnet have the same configuration of the first end 62 of the first yoke 61, the second end 65 of the second yoke 64, and the first magnet 67, the explanation of which is omitted.

A gap width W3 of a gap 68 between an outer arc portion 63 of the first yoke 61 and an inner arc portion 66 of the second yoke 64 may be minimized according to the size of the molding member which molds a Hall element. A magnet width W4 of the first magnet 67 is set to have an optimum value for generating a required magnetic flux, independently from the gap width W3. In the present embodiment, the magnet width W4 of the first magnet 67 is greater than the gap width W3, that is, the gap width W3 of the gap 68 is different from the magnet width W4 of the first magnet 67.

In the conventional gap width setting described above which sets the same width to both (i) the gap width between two yokes (i.e., an inter-yoke gap) and (ii) the width of the magnet, the width of the inter-yoke gap becomes too large (i.e., larger than required), which results in a position detector 60 having a large volume.

However, since the configuration of the position detector in the second embodiment allows a free setting of the gap width W3 of the gap 68, that is, free from and independent of the magnet width W4 of the first magnet 67 and from the width of the second magnet, the volume of the position detector 60 is reduced, similar to the first embodiment.

Third Embodiment

Figure 8:
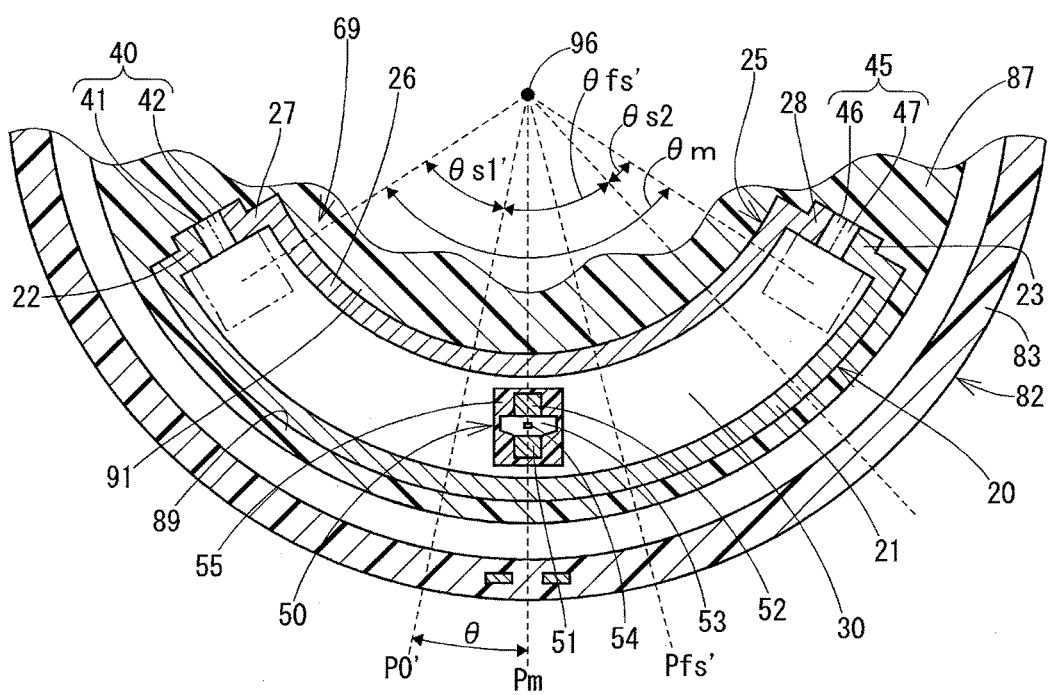
FIG. 8 is a sectional view of the position detector in a third embodiment of present disclosure.
Figure 9:
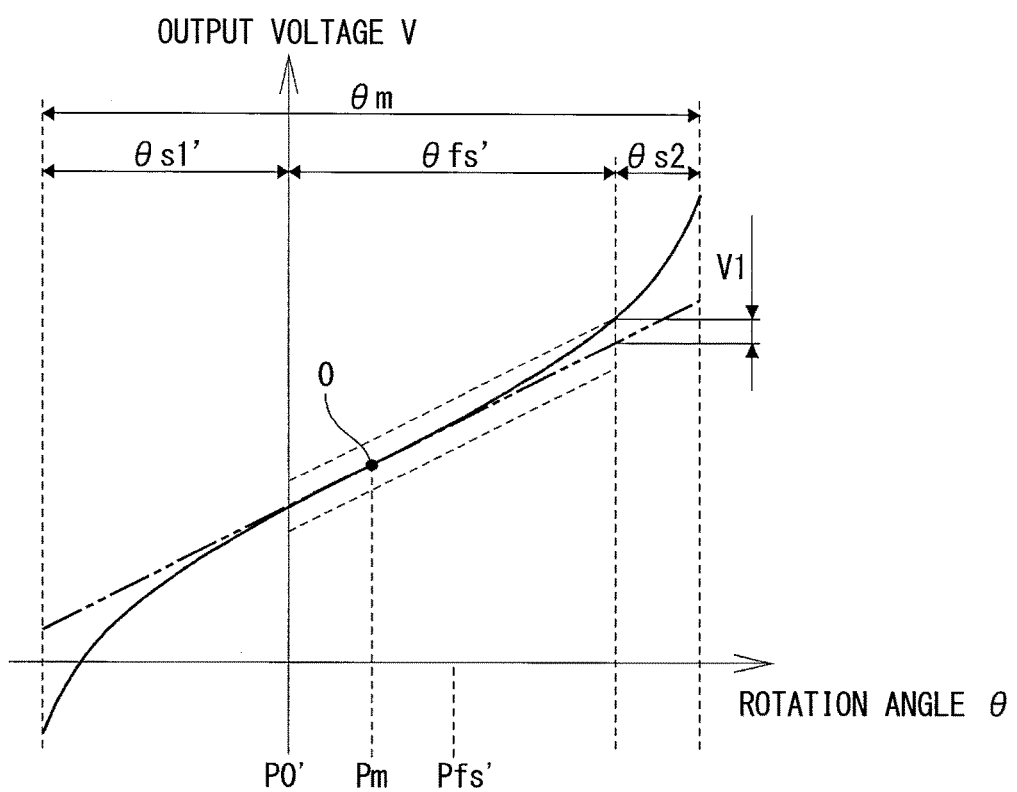
FIG. 9 is an output characteristic diagram of the Hall element in FIG. 8.

The position detector in the third embodiment of the present disclosure is explained based on FIGS. 8 and 9.

A position detector 69 has a first surplus angle $\theta s1'$ set to be greater than the second surplus angle $\theta s2$. Therefore, a center position Pfs' of the detection range $\theta fs'$ along the direction of relative movement shifts towards the second magnet 45 relative to the center position Pm of the range of movement $\theta m$.

In the third embodiment, an original point P0', at which the rotation angle $\theta$ is equal to 0 (zero), is closer to the center position Pm in comparison to the original point P0 of the first embodiment. As a result, the detection accuracy at positions close to the original position P0' is improved because the temperature characteristics are improved the closer the original position P0' is to the center position Pm. Therefore, in the close proximity of a fully-closed position of the wastegate valve, which corresponds to a position around the original position P0', the wastegate valve to which the position detector 69 in the third embodiment is applied is enabled to perform a highly accurate valve opening degree control.

Fourth Embodiment

Figure 10:
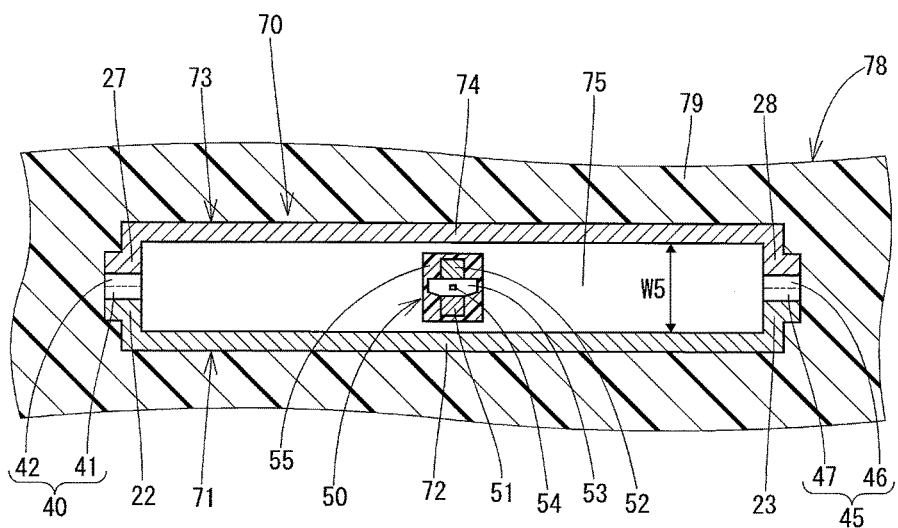
FIG. 10 is a sectional view of the position detector in a fourth embodiment of the present disclosure.

The position detector in the fourth embodiment of the present disclosure is explained based on FIG. 10.

A position detector 70 is applied to a shift actuator 78. The shift actuator 78 is an actuator which is disposed in, for example, a gearbox which comprises, an automated manual transmission, a dual-clutch transmission or the like. The shift actuator 78 may perform a shift operation and a position range selection operation. An output member 79 of the shift actuator 78 linearly moves against a housing (non-illustrated). In other words, the move of the output member 79 is a linear movement relative to the housing. The output member 79 is equivalent to a detection object in the claims, and the above-mentioned housing is equivalent to a reference part in the claims.

The position detector 70 has a closed magnetic circuit that includes a first yoke 71, a second yoke 73, the first magnet 40, and the second magnet 45. The first yoke 71 has a straight shape extending along the path of the relative movement of the output member 79, and has a first straight portion 72. The first yoke 71 is fixed onto the output member 79, and is equivalent to a first magnetic flux transmission part in the claims.

The second yoke 73 also has a straight shape along the path of the relative movement of the output member 79, and has a second straight portion 74. The second yoke 73 is fixed onto the output member 79, and is equivalent to a second magnetic flux transmission part in the claims.

The first yoke 71 and the second yoke 73 define a gap 75 at a position in-between the first yoke 71 and the second yoke 73. A gap width W5 of the gap 75 is constant at all positions along the relative movement path of the output member 79, and may be minimized according to the size of the molded member 55. In the present embodiment, the magnet width W2 is smaller than the gap width W5.

According to the fourth embodiment, the gap width W5 of the gap 75 and the magnet width W2 of the first magnet 40 and the second magnet 45 are independent from each other, and are arbitrarily determined. Therefore, according to the fourth embodiment, the volume of the position detector 70 is reduced, in the same manner as the first embodiment.

Other Embodiments

According to other embodiments of the present disclosure, a closed-circuit formation member may be disposed in a case, and a Hall IC may be provided on the rotating body.

According to other embodiments of the present disclosure, the first magnet and the second magnet may be replaced with, for example, a magnetic flux generator of another type, such as an electric magnet or the like.

According to other embodiments of the present disclosure, a position detector may be disposed on other rotating parts or components, such as a final speed reduction member of a speed reducer that is disposed as a component between a motor and an output shaft.

According to other embodiments of the present disclosure, a rotary drive apparatus may be applied not only to a wastegate valve device but also to other devices, such as a variable vane controller having a variable turbo capacity, a valve operation device for an exhaust gas throttle or an exhaust gas switch valve, a valve operation device for a variable intake mechanism and the like.

Although the present disclosure has been fully described in connection with the above embodiment thereof with reference to the accompanying drawings, it is to be noted that various changes and modifications will become apparent to those skilled in the art, and such changes and modifications are to be understood as being within the scope of the present disclosure as defined by the appended claims.

What is claimed is:

1. A position detector detecting a position of a detection object that moves relative to a reference part, the position detector comprising:
    a first magnetic flux transmission part disposed on one of the reference part or the detection object, the first magnetic flux transmission part having an outer first end, an outer second end and an outer arc portion;
    a second magnetic flux transmission part disposed to define a gap between the first magnetic flux transmission part and the second magnetic flux transmission part, the second magnetic flux transmission part having an inner first end, an inner second end and an inner arc portion;
    a first magnetic flux generator positioned between the outer first end of the first magnetic flux transmission part and the inner first end of the second magnetic flux transmission part;
    a second magnetic flux generator positioned between the outer second end of the first magnetic flux transmission part and the inner second end of the second magnetic flux transmission part; and
    a magnetic flux density detector positioned within the gap, disposed on another of the reference part or the detection object, and outputting a signal according to a density of a magnetic flux passing through the magnetic flux density detector, wherein
    the gap has a gap width in an orthogonal direction between the first magnetic flux transmission part and the second magnetic flux transmission part, and a width of the first magnetic flux generator in the orthogonal direction and a width of the second magnetic flux generator in the orthogonal direction are smaller than the gap width,
    the first magnetic flux transmission part and the second magnetic flux transmission part directly contact the first magnetic flux generator and the second magnetic flux generator only by the ends of the first magnetic flux transmission part and the second magnetic flux transmission part,
    the outer first end comprises (i) a first part extending radially-inwardly toward an axial center of the position detector from a radial-inward side of a circumferential-direction end of the outer arc portion to abut the first magnetic flux generator at an end of the extension of the first part and (ii) a second part extending from the first part along a circumferential direction away from the outer arc portion and abutting the first magnetic flux generator at a radial-inward side of the second part, a radial width of the second part perpendicular to the circumferential direction being less than a length of the extension of the first part, wherein the first part and the second part together give the outer first end a first L-shaped profile, the outer second end comprises (i) a third part extending radially-inwardly toward the axial center from a radial-inward side of another circumferential-direction end of the outer arc portion to abut the second magnetic flux generator at an end of the extension of the third part and (ii) a fourth part extending from the third part along the circumferential direction away from the outer arc portion and abutting the second magnetic flux generator at a radial-inward side of the fourth part, a radial width of the fourth part perpendicular to the circumferential direction being less than a length of the extension of the third part, wherein the third part and the fourth part together give the outer second end a second L-shaped profile, the inner first end comprises (i) a fifth part extending radially-outwardly away from the axial center from a radial-outward side of a circumferential-direction end of the inner arc portion to abut the first magnetic flux generator at an end of the extension of the fifth part and (ii) a sixth part extending from the fifth part along the circumferential direction away from the inner arc portion and abutting the first magnetic flux generator at a radial-outward side of the sixth part, a radial width of the sixth part perpendicular to the circumferential direction being less than a length of the extension of the fifth part, wherein the fifth part and the sixth part together give the inner first end a third L-shaped profile, and the inner second end comprises (i) a seventh part extending radially-outwardly away from the axial center from a radial-outward side of another circumferential-direction end of the inner arc portion to abut the second magnetic flux generator at an end of the extension of the seventh part and (ii) an eighth part extending from the seventh part along the circumferential direction away from the inner arc portion and abutting the second magnetic flux generator at a radial-outward side of the eighth part, a radial width of the eighth part perpendicular to the circumferential direction being less than a length of the extension of the seventh part, wherein the seventh part and the eighth part together give the inner second end a fourth L-shaped profile.

2. The position detector of claim 1, wherein
the first magnetic flux transmission part and the second magnetic flux transmission part are disposed on the detection object, and
the magnetic flux density detector is disposed on the reference part.

3. The position detector of claim 1, wherein when a detection range is defined as an angular range within which a position of the detection object is detected, a range of movement is defined as a range of movement of the magnetic flux density detector within the gap, an actual output line represents a relationship between the position of the detection object and the output signal of the magnetic flux density detector, a point 0 is defined as a point on the actual output line where an amount of the magnetic flux passing through the magnetic flux density detector is equal to zero, and an ideal straight line is defined as a line passing the point 0 and having an ideal slope, wherein the position detector is configured so that the output signal is such that a difference between the actual output line and the ideal straight line in the detection range is less than or equal to a predetermined value.

4. The position detector of claim 1, wherein
the detection object rotates relative to the reference part, and
the first magnetic flux transmission part and the second magnetic flux transmission part have an arc shape that extends along a direction of relative movement of the detection object with respect to the reference part.

5. The position detector of claim 1, wherein
the gap width is constant at all positions along an extent of relative movement of the magnetic flux density detector relative to the first magnetic flux transmission part.

6. The position detector of claim 1, wherein
the gap width is constant at all positions along a direction of relative movement, where the direction of relative movement is defined as a direction of a movement of the magnetic flux density detector relative to the first magnetic flux transmission part.

* * * * *